United States Patent
Pu et al.

(10) Patent No.: US 9,083,346 B2
(45) Date of Patent: Jul. 14, 2015

(54) TOUCH CONTROL SYSTEM AND SENSING METHOD THEREOF

(71) Applicant: GIANTPLUS TECHNOLOGY CO., LTD., Toufen Township, Miaoli County (TW)

(72) Inventors: Chia-Chuan Pu, Toufen Township (TW); Kuo-Sheng Sun, Toufen Township (TW); Chien-Ying Peng, Toufen Township (TW)

(73) Assignee: GIANTPLUS TECHNOLOGY CO., LTD., Toufen Township, Miaoli County (TW)

( * ) Notice: Subject to any disclaimer, the term of this patent is extended or adjusted under 35 U.S.C. 154(b) by 468 days.

(21) Appl. No.: 13/708,133

(22) Filed: Dec. 7, 2012

(65) Prior Publication Data

US 2014/0159505 A1    Jun. 12, 2014

(51) Int. Cl.
*H03K 17/96* (2006.01)
*G05F 1/10* (2006.01)

(52) U.S. Cl.
CPC ......... *H03K 17/9622* (2013.01); *Y10T 307/766* (2015.04)

(58) Field of Classification Search
USPC ............................................. 307/98, 132 EA
See application file for complete search history.

(56) References Cited

U.S. PATENT DOCUMENTS

2011/0310036 A1*  12/2011  Juan et al. ..................... 345/173

* cited by examiner

*Primary Examiner* — Robert Deberadinis
(74) *Attorney, Agent, or Firm* — Muncy, Geissler, Olds & Lowe, P.C.

(57) ABSTRACT

A touch control system and a sensing method thereof. Wherein, a plurality of sensor units are connected respectively to a control electrode line and a detection electrode line. Each sensor unit includes: a first switching element and a second switching element connected in parallel, and a sensing electrode connected to the second switching element. A common electrode provides a trigger signal to each sensing electrode to form coupling. The control electrode line is used to selectively output a turn-off signal in sequence to each of the first switching elements, so that the detection electrode line acts in cooperation with the sensor unit, in response to the turn-off signal. When a touch action occurs, the sensing electrode utilizes the detection electrode line to detect variations of current signal passing through the sensor unit, based on turn-on extent of the second switching element, hereby obtaining at least a touch message.

19 Claims, 5 Drawing Sheets

Fig. 1 (Prioir Art)

TOUCH CONTROL SYSTEM AND SENSING METHOD THEREOF

BACKGROUND OF THE INVENTION

1. Field of the Invention

The present invention relates to a touch control system and a sensing method thereof, and in particular to a touch control system and a sensing method thereof, that utilizes a turn-off signal as a trigger signal to monitor current variations.

2. The Prior Arts

In recent years, with the rapid progress of science and technology, various information devices are developed, produced, and put into use. In this respect, for the data input device, since volume of data processing is increasing rapidly, such that in case data is input only through a mouse or a keyboard, and output through a screen, for many applications, it tends to be rather slow. For this reason, the touch control panel has come into being. The touch control panel is able to give the feeling of a personalized input interface, that can be operated directly by users of any age brackets through touching menu items on a touch screen by means of a finger or a pen, to bring quite convenience to our daily life.

For the touch control panel technology at present, refer to FIG. 1 for a schematic diagram of a thin-film-transistor (TFT) matrix touch control system of the prior art. As shown in FIG. 1, the touch control system includes a touch control substrate 10 and a touch control circuit 12. On the touch control substrate 10 is provided with a plurality of sensing electrode units 14 arranged in an array, and a control electrode line group 16 and a detection electrode line group 18 crossing each other. Each sensing electrode unit 14 includes a TFT element 142, and a sensing electrode 144 connected to the TFT element 142. The control electrode line group 16 and the detection electrode line group 18 are connected respectively to the gate and source of the TFT element 142; and the sensing electrode units 14 is connected to the drain of the TFT element 142. The control electrode line group 16 controls the turn-on and turn-off of the TFT element 142. The detection electrode line group 18 is connected to the sensing electrode 144 through the TFT element 142.

The touch control circuit 12 includes: a control circuit 122, a signal detector circuit 124, and a driving source 126. The signal detector circuit 124 is connected electrically to the driving source 126 and the detection electrode line group 18. The control circuit 122 is connected electrically to the control electrode line group 16. The control circuit 122, in a scanning approach, outputs a turn-on signal column-by-column to each control electrode line of the control electrode line group 16, so that the TFT element 142 connected to the control electrode line having the turn-on signal is in a turn-on state, and the remaining TFT elements 142 are in a turn-off state. In this approach, the control circuits 122 controls column-by-column the TFT elements 142 on the control electrode line group 16 to be in a turn-on state. At this time, the detection electrode line group 18 acts in cooperation with the turn-on signal, inputs the touch control signal of the driving source 126 to the detection electrode line, so that the touch control signal thereon will flow through the TFT element 142, to the sensing electrode 144 connected to the control electrode line respectively. As such, along with the control circuit 122 outputs the turn-on signal column-by-column to the respective control electrode line, the signal detection circuit 124 detects column-by-column the variations of touch control signals on the sensing electrode unit 14 connected to the control electrode line. When a touch occurs, then the detection electrode line having its touch control signal variations greater than a threshold value can be found. Then, based on the control electrode line of the turned on TFT element 142, it can locate the sensing electrode unit 14 producing leakage current, thus finding the touch position.

The conventional circuit design mentioned above can only detect touch position, but it can not display. Therefore, an additional display substrate is required to use a gluing process to combine a touch control substrate with a display substrate into a touch control display. However, this kind of design increases its volume and circuit complexity, thus not being able to achieve compact size and thin profile. Moreover, when the variation of touch control signals on the detection electrode line is small, the touch position can not be detected accurately. Therefore, how to raise the detection sensitivity, and reduce its volume effectively, while reducing its cost, is a task that has to be accomplished urgently in this field.

SUMMARY OF THE INVENTION

In view of the problems and shortcomings of the prior art, the present invention provides a touch control system and a sensing method thereof, so as to overcome the problems of the prior art.

A major objective of the present invention is to provide a touch control system and a sensing method thereof, that combines a display circuit and a touch control circuit, and utilizes the AC signal from the common electrode for display as a trigger signal, to reduce thickness of the overall touch control display panel, to be compatible of the present trend of lightweight, compact size and thin profile.

Another objective of the present invention is to provide a touch control system and a sensing method thereof. Wherein, the voltage can be adjusted to amplify the detected signal, to raise the detection sensitivity.

In order to achieve the above-mentioned objective, the present invention provide a touch control system and a sensing method thereof, comprising a plurality of control electrode lines, a plurality of detection electrode lines, and a plurality of sensor units. The detection electrode lines and the control electrode lines are disposed in a crossing arrangement. The sensor units are connected to the control electrode line and detection electrode line. Each sensor unit includes: a first switching element and a second switching element connected in parallel, and a sensing electrode connected to the second switching element. The sensing electrode is coupled to a common electrode of the display circuit, and is used to send out a trigger signal to a touch control transistor array on a color filter substrate. The trigger signal is an alternating current (AC) signal, that is provided by the common electrode to the sensing electrode. The control electrode line selectively outputs a turn-off signal in sequence to each of the first switching elements. At this time, the detection electrode line acts in cooperation with the detector sensor unit corresponding to the turn-off signal. When a touch occurs, based on the turn-on extent of the second switch unit, the sensing electrode enables the detection electrode line to detect the variations of current signal on the sensor unit, so as to obtain at least a touch message.

The present invention further provides a touch control sensing method, including the following steps: provide a trigger signal to a plurality of sensor units; switch in sequence each of the sensor units to turn-off, and detect in sequence the current signal of the corresponding sensor unit; and detect variations of current signal, and output a corresponding touch message, to continue detecting current signal of the sensor unit repeatedly.

Further, scope of the applicability of the present invention will become apparent from the detailed description given hereinafter. However, it should be understood that the detailed description and specific examples, while indicating preferred embodiments of the present invention, are given by way of illustration only, since various changes and modifications within the spirit and scope of the present invention will become apparent to those skilled in the art from this detailed description.

BRIEF DESCRIPTION OF THE DRAWINGS

The related drawings in connection with the detailed description of the present invention to be made later are described briefly as follows, in which.

DETAILED DESCRIPTION OF THE PREFERRED EMBODIMENT

The purpose, construction, features, functions and advantages of the present invention can be appreciated and understood more thoroughly through the following detailed description with reference to the attached drawings. And, in the following, various embodiments are described in explaining the technical characteristics of the present invention.

Figure 1:
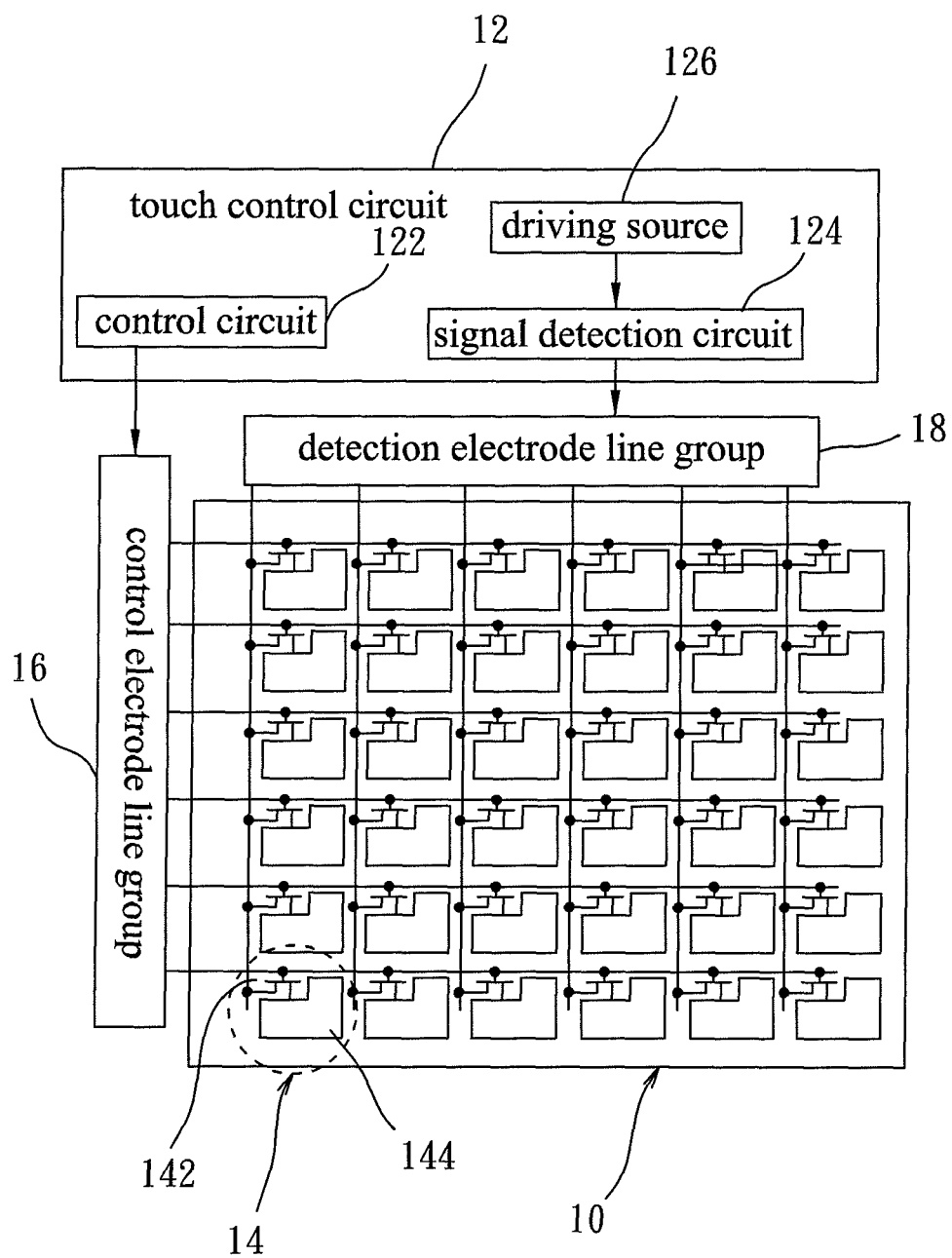
FIG. 1 is a schematic diagram of a thin-film-transistor (TFT) array touch control system of the prior art.
Figure 2:
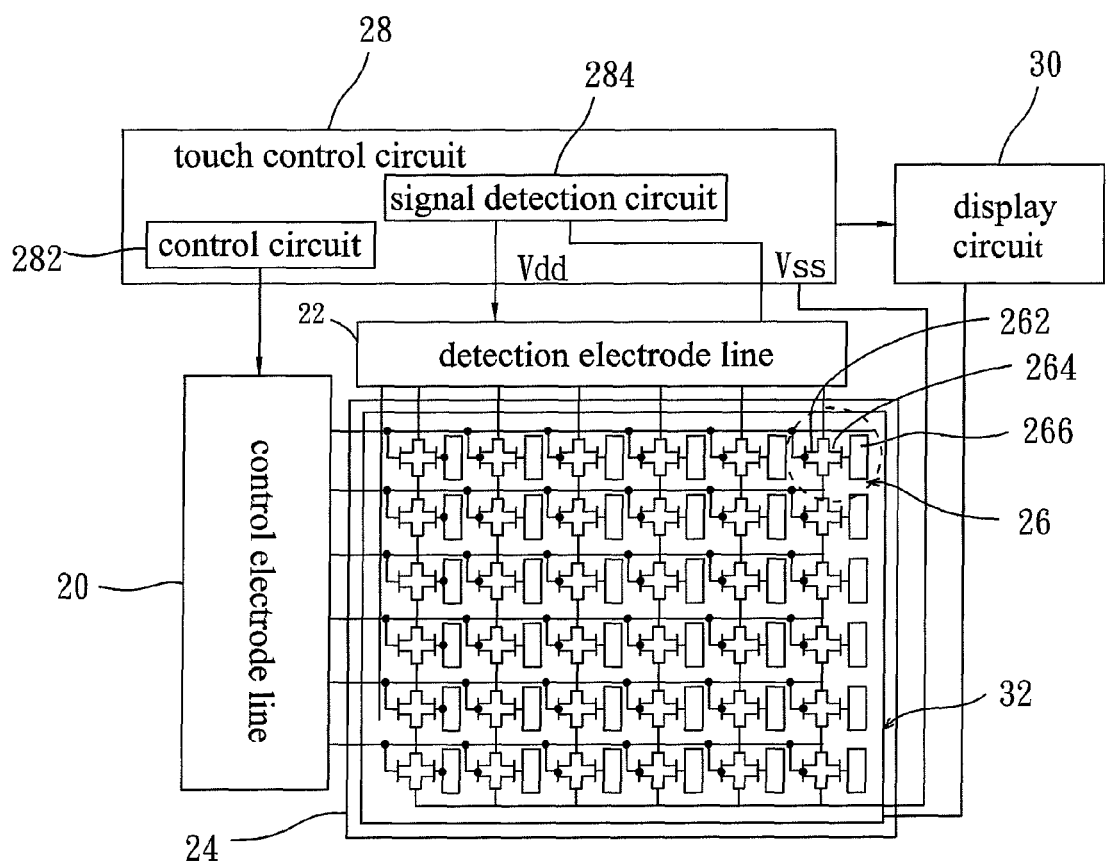
FIG. 2 is a schematic diagram of a touch control system according to the present invention.

The present invention provides a novel touch control system, wherein, a display substrate and a touch control substrate are combined to accommodate circuits, to simply the manufacturing process, reduce size and cost of the product. Refer to FIG. 2 for a schematic diagram of a touch control system according to the present invention. As shown in FIG. 2, the touch control system includes: a plurality of control electrode lines 20, a plurality of detection electrode lines 22, and a plurality of sensor units 26. Wherein, the plurality of sensor units 26 are disposed in an array on a color filter substrate 24, such that the detection electrode lines 22 and the control electrode lines 20 cross with each other. At the cross positions of the detection electrode lines 22 and the control electrode lines 20, an insulation layer is provided to separate them. Wherein, the sensor units 26 can be arranged in an array on the upper surface or the lower surface of the color filter substrate 24, to reduce the production cost and complexity of the prior art that an additional touch control substrate including the sensor unit is required. The sensor units 26 are connected to the respective control electrode lines 20 and detection electrode lines. Each sensor unit 26 includes: a first switching element 262 and a second switching element 264 connected in parallel, and a sensing electrode 266 connected to the second switching element 264.

In the descriptions mentioned above, each control electrode line 20 is connected to the first switching element 262 of the same row, and each detection electrode line 22 is connected to the respective sensor units 26 connected in series in a same column. To be more specific, the gates of the first switching element 262 and second switching element 264 are connected to the respective control electrode line 20 and sensing electrode 266. The drains of the first switching element 262 and the second switching element 264 are connected to each other. The sources of the first switching element 262 and the second switching element 264 are also connected to each other. Two ends of each detection electrode line 22 are connected respectively to a drain of the first sensor unit 26, and the source of the last sensor unit 26 (namely, the sensor unit of the last column in the array). The drain of the sensor unit 26 is connected in series with the source of an adjoining another sensor unit, to form into a detection electrode line connected in series.

Moreover, the touch control system further includes a touch control circuit 28 and a display circuit 30, such that the display circuit 30 is connected electrically to the touch control circuit 28. The touch control circuit 28 includes a control circuit 282 and a signal detection circuit 284, connected respectively to the control electrode line 20 and the detection electrode line 22. The sensing electrode 266 of each sensor unit is coupled to a common electrode 32, and that is connected to the display circuit 30. The common electrode 32 is a common electrode used for display, so that it provides a trigger signal of Alternating Current (AC) voltage to the sensing electrode 266. The control circuit 282 drives the control electrode line 20 column-by-column in a scanning way to output a turn-off signal to the first switching element 262. At this time, the signal detector circuit 284 acts in cooperation with the turn-off signal, detects the variations of current signal on the corresponding detection electrode line 22. It is worth to note that, when the control electrode line 20 does not provide the turn-off signal, the first switching element 262 is in a continuous turn-on state and thought as a low resistance circuit compared to the second switching element 264. Therefore, the sensing electrode 266 provides continuously the trigger signal of AC voltage to the second switching element 264, so that the turn-on extent of the second switching element 264 can be varied along with the variations of the AC voltage provided by the common electrode 32, and the turn-on extent of the second switching element 264 is less than that of the first switching element 262. Since in general, the liquid crystal can only sustain a voltage from 0~4 volts, so the activation voltage of the common electrode 32 is designed to be around ±2~3 volts. In other words, when the common electrode 32 provides a trigger signal to the sensing electrode 266, a coupling is formed between them. At this time, under the condition of a touch is not been occurred, the sensing electrode 266 provides a stable AC trigger signal to the second switching element 264. Of course, the turn-on extent of the second switching element 264 must be less than that of the first switching element 262. Since the first switching element 262 is a thin-film-transistor (TFT), having its characteristic that 15 volts activation voltage is required to turn on its gate to form a turn-on state.

Figure 3:
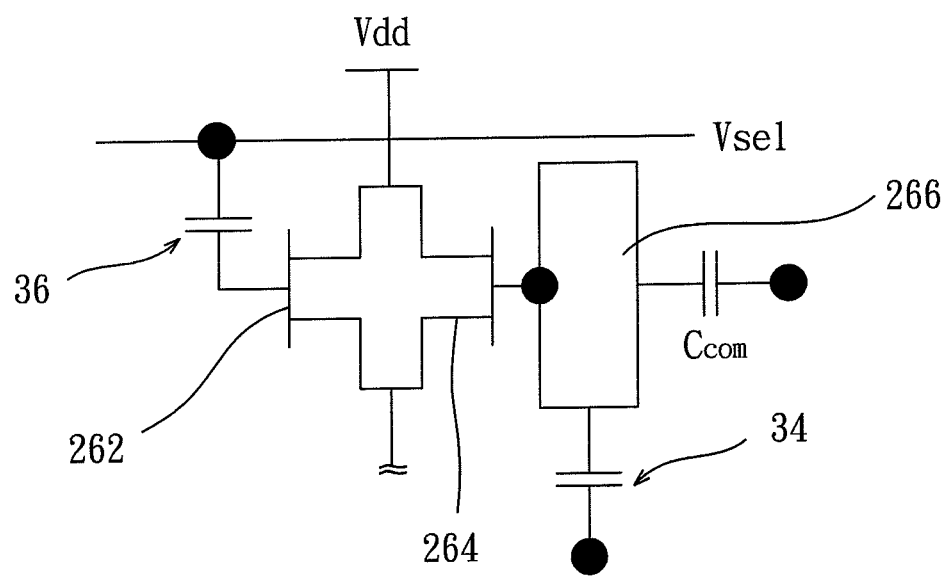
FIG. 3 is a circuit diagram of a sensor unit of a touch control system according to the present invention.
Figure 4:
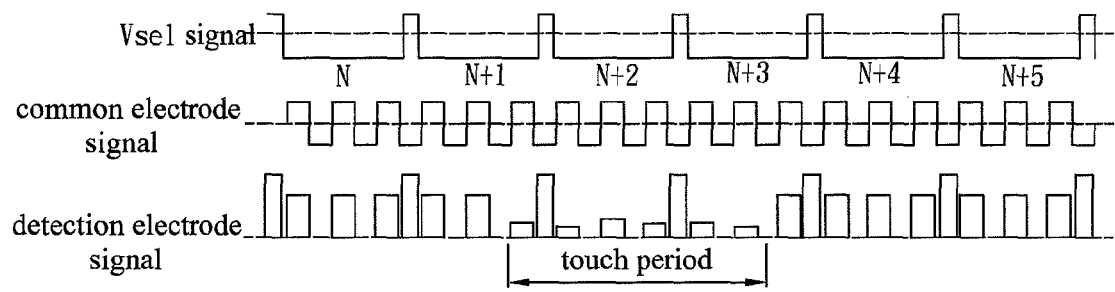
FIG. 4 is a waveform of the signals from a circuit of a touch control system according to the present invention.

Furthermore, refer to FIGS. 2, 3, and 4 at the same time. FIG. 3 is a circuit diagram of a sensor unit of a touch control system according to the present invention, and FIG. 4 is a waveform of the signals from a circuit of a touch control system according to the present invention. As shown in FIGS. 2, 3, and 4, the control circuit 282 drives the control electrode line 20 column-by-column in a scanning way to output a turn-off signal to the first switching element 262. As shown in the waveform diagram of the Vsel signal output by the control electrode line 20, wherein, in the horizontal axis, N to N+5 indicate the Vsel signal output column-by-column, to control in sequence the sensor units 26 arranged in an array, to output the turn-off signals, such as the first column is N, the second column is N+1, . . . etc. The common electrode 32 provides continuously the trigger signals of AC voltage (as shown in the waveform diagram of the common electrode signal) to the sensing electrode 266, to form coupling between the common electrode 32 and the sensing electrode 266 to produce a coupling capacitance ($C_{com}$). When the sensor unit 26 is not touched, the turn-on extent of the second switching element 264 controlled by the sensing electrode 266 varies regularly. When at least a sensor unit 26 is touched, the sensing electrode 266 produces a corresponding sensing capacitance 34. At this time, the current on the sensing electrode 266 will be released, so that the voltage on the gate of the second switching element 264 is reduced, to make it to produce corresponding turn-on extent. That will enable the detection electrode line 22 to detect the variations of current signal on the sensor unit 26, so as to obtain at least a touch message, as shown in the waveform diagram of the sensing electrode signal. In other words, in the duration the sensor unit 26 being touched, the sensing electrode 266 will indeed have current leakage, to cause the current regularity of the detection electrode line 22 to be affected. Wherein, each sensor unit 26 further includes a passive element 36, such as a capacitor, with its two ends connected respectively to the gate of the first switching element 262 and the control electrode line 20. Since the common electrode 32 provides AC voltage of only ±2~3 volts, so that the turn-on extent of the second switching element 264 controlled by the sensing electrode 266 varies only slightly, even some variations can not be detected at all. Therefore, in order to raise detection sensitivity, in the circuit design of the present invention, two ends of the detection electrode line 22 are connected respectively to the power supply (Vdd) and the ground (Vss) of the signal detector circuit 284. Namely, the first column sensor units 26 in the array are used to serve as the beginning end and are connected to the power supply, while the last column detector units 26 in the array are used to serve as the terminating end and are connected to the ground, to produce a voltage difference. In this approach, the voltage of the power supply can be adjusted to amplify the detection signal, so that even when only one sensor unit 26 is touched, the slight current variations on the sensor unit 26 can be detected, so as to raise the detection sensitivity.

Figure 5:
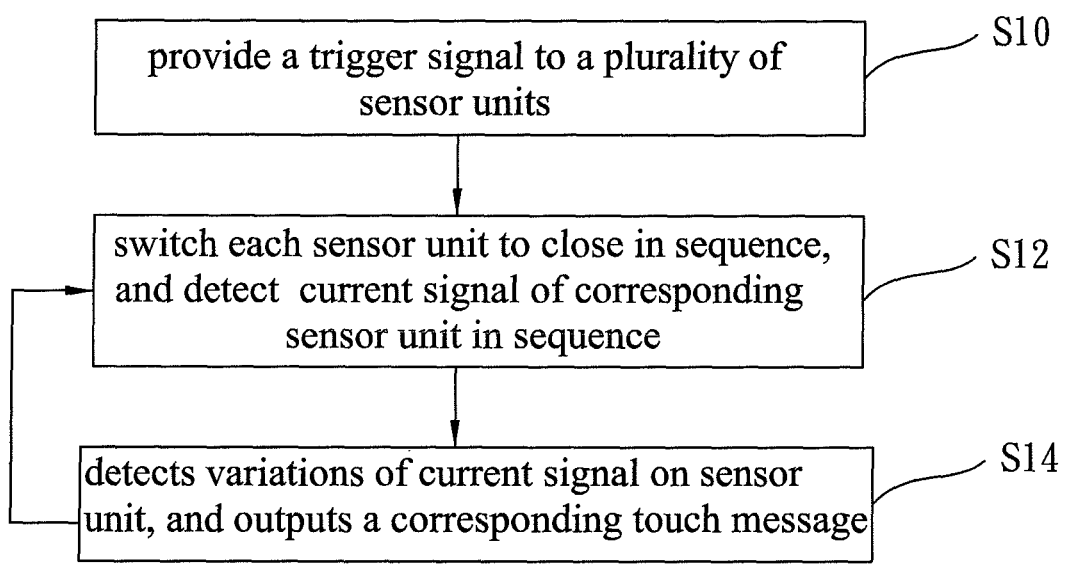
FIG. 5 is a flowchart of the steps of a touch control sensing method according to the present invention.

Refer to FIGS. 2 and 5 at the same time. FIG. 5 is a flowchart of the steps of a touch control sensing method according to the present invention. As shown in FIG. 5, firstly, in step S10, provide a trigger signal of AC voltage to a plurality of sensor units 26. The sensor units 26 are arranged in an array, and are connected through a plurality of control electrode lines 20 and a plurality of detection electrode lines 22 crossing each other. Next, as shown in step S12, through the control electrode lines 20, switch sequentially each sensor unit 26 to turn-off, then through the detection electrode line 22 to detect in sequence the current signal of the corresponding sensor unit 26. On the contrary, when these sensor units 26 are not switched to turn-off, the first switching element 262 of each sensor unit 26 is in a continuous turn-on state. At this time, the sensing electrode 266 of each sensor unit 26 provides the trigger signal to the second switching element 264 connected in parallel with the first switching element 262, so that the turn-on extent of the second switching element 264 is less than that of the first switching element 262, to detect in sequence the current signal on the corresponding sensor unit 26, hereby detecting if the current signal on the sensor unit 26 is varied. Finally, as shown in step S14, detect the variations of current signal of the sensor unit 26, to output the corresponding touch message, and then repeat step S12 continuously.

Summing up the above, in the present invention, a display circuit and a touch control circuit are combined, to use an AC signal of the common electrode of the display system as a trigger signal, to reduce thickness of the touch control display module, and be compatible of the present trend of compact-size, light-weight, and thin profile. Moreover, in the present invention, the detection approach is to treat the turn-on signal to be in a normal state, and the turn-off signal to be in a trigger state, the way of its detecting current signal variations is different from that of the prior art. The voltage of the power supply can be adjusted to amplify the detection signal, to raise detection sensitivity and improve the inferior detection accuracy in the prior art.

The above detailed description of the preferred embodiment is intended to describe more clearly the characteristics and spirit of the present invention. However, the preferred embodiments disclosed above are not intended to be any restrictions to the scope of the present invention. Conversely, its purpose is to include the various changes and equivalent arrangements which are within the scope of the appended claims.

What is claimed is:

1. A touch control system, comprising:
   a plurality of control electrode lines;
   a plurality of detection electrode lines, crossing said control electrode lines; and
   a plurality of sensor units, connected respectively to said control electrode lines and said detection electrode lines, each said sensor unit includes: a first switching element and a second switching element connected in parallel, and a sensing electrode connected to said second switching element, said sensing electrode is coupled to a common electrode, that provides a trigger signal to said sensing electrode, said control electrode line selectively outputs in sequence a turn-off signal to each said first switching element, at this time, said detection electrode line acts in cooperation with said turn-off signal to detect corresponding said sensor unit, when a touch occurs, said sensing electrode turns on said second switching element to its turn-on extent, so that said detection electrode line detects variations of current signal on said sensor unit, to obtain at least a touch message.

2. The touch control system as claimed in claim 1, wherein when said control electrode line does not supply said turn-off signals, said first switching element is in a continuous turn-on state, and at this time, said sensing electrode provides said trigger signal to said second switching element, so that turn-on extent of said second switching element is less than that of said first switching element.

3. The touch control system as claimed in claim 1, wherein when at least a said sensor unit is touched, said sensing electrode produces a corresponding sensing capacitance, so that voltage on a gate of said second switching element is reduced, to make it to produce said corresponding turn-on extent, and to enable said detection electrode line to detect variations of said current signal on said sensor unit, to obtain said touch message.

4. The touch control system as claimed in claim 1, wherein said first switching element and said second switching element are thin-film transistors (TFT).

5. The touch control system as claimed in claim 1, wherein said sensor units are arranged in an array, such that each said control electrode line is connected respectively to said first switching element in a same row, and each said detection electrode line is connected in series respectively to said sensor unit in a same column.

6. The touch control system as claimed in claim 5, wherein gates of said first switching element and said second switching element are connected respectively to said control electrode lines and said sensing electrode, drains of said first switching element and said second switching element are connected to each other, sources of said first switching element and said second switching element are connected to each other, two ends of each said detection electrode line are connected respectively to said drain of first said sensor unit and said source of last said sensor unit, and said drain of said sensor unit is connected in series with said source of another said sensor unit.

7. The touch control system as claimed in claim 1, wherein said sensor unit further includes a passive element, with its two ends connected respectively to said gate of said first switching element and said control electrode line.

8. The touch control system as claimed in claim 7, wherein said passive element is a capacitor.

9. The touch control system as claimed in claim 1, further comprising:
a touch controlling circuit, including a controlling circuit and a signal detection circuit, connected respectively to said control electrode lines and said detection electrode lines, said control circuit drives said control electrode lines in a scanning way to output column-by-column said turn-off signal to said first switching element, said signal detection circuit uses said turn-off signal to detect variations of current signal on said corresponding detection electrode lines.

10. The touch control system as claimed in claim 1, wherein said sensor units are arranged in an array on an upper surface or a lower surface of a color filter substrate.

11. The touch control system as claimed in claim 1, further comprising a display circuit, connected to said common electrode, and it provides said trigger signal of alternating current (AC) voltage to said sensing electrode, so that said sensing electrode and said common electrode form into a coupling, to turn on said second switching element to turn-on extent.

12. The touch control system as claimed in claim 9, wherein two ends of said detection electrode lines are connected respectively to a power supply and a ground of said signal detection circuit, to produce a voltage difference, and said current signal on said detection electrode lines are varied corresponding to current on said sensor unit.

13. A touch control sensing method, including following steps:
provide a trigger signal to a plurality of sensor units;
switch each said sensor unit to turn-off in sequence, and detect current signal of corresponding said sensor unit in sequence; and
detect variations of said current signal, output a touch message, and repeat previous step to detect said current signal of said sensor unit.

14. The touch control sensing method as claimed in claim 13, wherein when said sensor unit is not switched to turn-off, a first switching element of each said sensor unit is in a continuous turn-on state, at this time, a sensing electrode of each said sensor unit provides said trigger signal to a second switching element connected in parallel with said first switching element, so that turn-on extent of said second switching element is less than that of said first switching element, to detect in sequence said current signal on corresponding said sensor unit.

15. The touch control sensing method as claimed in claim 13, wherein in said step of detecting variations of said current signal, at least a said sensor unit is touched, at this time, a sensing electrode of said sensor unit produces a corresponding induced a sensor capacitance, to reduce voltage on a gate of said second switching element connected to said sensing electrode, to make it produce a corresponding turn-on extent, to detect variations of said current signal on said sensor units, and output said corresponding touch message.

16. The touch control sensing method as claimed in claim 13, wherein said sensor units are arranged in an array, and are connected to each other through a plurality of control electrode lines and a plurality of detection electrode lines crossing each other vertically, said control electrode lines switch in sequence each said sensor unit to turn-off, then said detection electrode lines detect in sequence said current signal of said sensor unit.

17. The touch control sensing method as claimed in claim 16, wherein through driving of a control circuit, said control electrode lines switch each said sensor unit in sequence in a scanning way to turn-off, and use a signal detection circuit to detect in sequence said current signal on said detection electrode lines.

18. The touch control sensing method as claimed in claim 17, wherein when said signal detection circuit detects variations of current signal on said detection electrode lines, output a corresponding said touch message.

19. The touch control sensing method as claimed in claim 13, wherein said trigger signal is an alternating current (AC) voltage.

* * * * *